(12) United States Patent
Alie

(10) Patent No.: US 7,910,391 B2
(45) Date of Patent: Mar. 22, 2011

(54) GETTER FORMED BY LASER-TREATMENT AND METHODS OF MAKING SAME

(75) Inventor: Susan Alie, Stoneham, MA (US)

(73) Assignee: SiOnyx, Inc., Beverly, MA (US)

( * ) Notice: Subject to any disclaimer, the term of this patent is extended or adjusted under 35 U.S.C. 154(b) by 233 days.

(21) Appl. No.: 12/204,296

(22) Filed: Sep. 4, 2008

(65) Prior Publication Data

US 2009/0261464 A1 Oct. 22, 2009

Related U.S. Application Data

(60) Provisional application No. 61/045,680, filed on Apr. 17, 2008.

(51) Int. Cl.
*H01L 21/00* (2006.01)

(52) U.S. Cl. .......... 438/58; 257/143; 257/310; 257/402; 257/417

(58) Field of Classification Search .................. 257/682, 257/E21.318, E21.321, 913; 438/58, 143, 438/310, 402, 471, FOR. 144, 473; 148/DIG. 24
See application file for complete search history.

(56) References Cited

U.S. PATENT DOCUMENTS

| | | |
|---|---|---|
| 4,201,450 A | 5/1980 | Trapani |
| 4,277,793 A | 7/1981 | Webb |
| 4,965,784 A | 10/1990 | Land et al. |
| 5,597,621 A | 1/1997 | Hummel et al. |
| 5,773,820 A | 6/1998 | Osajda et al. |
| 6,923,625 B2 * | 8/2005 | Sparks ............................ 417/48 |
| 7,057,256 B2 | 6/2006 | Carey, III et al. |
| 7,354,792 B2 | 4/2008 | Carey, III et al. |
| 7,390,689 B2 | 6/2008 | Mazur et al. |
| 7,442,629 B2 | 10/2008 | Mazur et al. |
| 2004/0077117 A1 | 4/2004 | Ding et al. |
| 2006/0231914 A1 | 10/2006 | Carey, III et al. |
| 2008/0258604 A1 | 10/2008 | Mazur et al. |

FOREIGN PATENT DOCUMENTS

WO 2008091242 A2 7/2008

OTHER PUBLICATIONS

"Infrared Absorption by Sulfur-Doped Silicon formed by Femtosecond Laser Irradiation"; Springer Berlin/Heidelberg, vol. 79. Nov. 2004.*
Carey, et al., "Fabrication of Micrometer-Sized Conical Field Emitters Using Femtosecond Laser-Assisted Etching of Silicon," Proc. IVMC 2001, 75-76, UC Davis, Davis, CA.
Carey, et al., "Field Emission from Silicon. Microstructures Formed by Femtosecond Laser Assisted Etching," Proc. CLEO 2001 (Baltimore, MD 2001) 555-557.
Carey, et al. "Femtosecond Laser-Assisted Microstructuring of Silicon for Novel Detector, Sensing and Display Technologies", LEOS 2002, 97-98, Glasgow, Scotland.

(Continued)

*Primary Examiner* — Jasmine J Clark
(74) *Attorney, Agent, or Firm* — Pepper Hamilton LLP

(57) ABSTRACT

The present disclosure relates to methods of treating a silicon substrate with an ultra-fast laser to create a getter material for example in a substantially enclosed MEMS package. In an embodiment, the laser treating comprises irradiating the silicon surface with a plurality of laser pulses adding gettering microstructure to the treated surface. Semiconductor based packaged devices, e.g. MEMS, are given as examples hereof.

7 Claims, 3 Drawing Sheets

OTHER PUBLICATIONS

Carey, et al., "High Sensitivity Silicon-Based VIS/NIR Photodetectors", Optical Society of America (2003) 1-2.

Carey, et al. "Femtosecond Laser-Assisted Microstructuring of Silicon for Novel Detector, Sensing and Display Technologies", LEOS 2003, 481-482, Tuscon, AR.

Carey et al., "Femtosecond-Laser-Assisted Microstructuring of Silicon Surfaces", Optics and Photonics News, 2003. 14, 32-36.

Crouch et al., "Infrared Absorption by Sulfur-Doped Silicon Formed by Femtosecond Laser Irradiation", Appl. Phys. A, 2004, 79, 1635-1641.

Crouch et al., "Comparison of Structure and Properties of Femtosecond and Nanosecond Laser-Structured Silicon" Appl. Phys. Lett., 2004, 84,1850-1852.

Dolgaev et al., "Formation of Conical Microstructures Upon Laser Evaporation of Solids", Appl. Phys. A, 2001, 73, 177-181.

Fowlkes et al., "Surface Microstructuring and Long-Range Ordering of Silicon Nanoparticles", Appl. Phys. Lett., 2002, 80 (20), 3799-3801.

Her et al., "Novel Conical Microstructures Created in Silicon With Femtosecond Laser Pulses", CLEO 1998, 511-512, San Francisco, CA.

Her et al., "Microstructuring of Silicon with Femtosecond Laser Pulses," Applied Physics Letters, 1998, 1673-1675, vol. 73, No. 12, American Institute of Physics.

Her, et al., "Femtosecond laser-induced formation of spikes on silicon," Applied Physics A, 2000, 70, 383-385.

Hu et al., "Solar Cells from Basic to Advanced Systems," McGraw Hill Book Co., 1983, 39, New York, New York.

Kolasinski, et al., "Laser Assisted and Wet Chemical Etching of Siicon Nanostructures," J. Vac. Sci. Technol. A 24(4), Jul./Aug. 2006, 1474-1479, American Vacuum Society, New York, New York.

Pedraza et al., "Surface Nanostructuring of Silicon", Appl. Phys. A, 2003, 77, 277-284.

Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.

Sanchez et al., "Dynamics of the Hydrodynamical Growth of Columns on Silicon Exposed to ArF Excimer-Laser Irradiation", Appl. Phys. A, 1998, 66, 83-86.

Sanchez et al., "Whiskerlike Structure Growth on Silicon Exposed to ArF Excimer Laser Irradiation", Appl. Phys. Lett., 1996, 69 (5), 620-622.

Serpengüzel et al., "Temperature Dependence of Photluminescence in Non-Crystalline Silicon", Photonics West (San Jose, CA, 2004) 454-462.

Shen et al., "Formation of Regular Arrays of Silicon Micorspikes by Femotsecond Laser Irradiation Through a Mask", Appl. Phys. Lett., 82, 1715-1717 (2003).

Solar Energy Research Institute, "Basic Photovoltaic Principles and Methods," Van Nostrand Reinhold Co., NY 1984, pp. 45-47 and 138-142.

Wu et al., "Black Silicon: A New Light Absorber," APS Centennial Meeting (Mar. 23, 1999).

Wu et al., "Femtosecond laser-gas-solid interactions," Thesis presented to the Department of Physics at Harvard University, pp. 1-113, 126-136, Aug. 2000.

Wu et al., "Visible Luminescence From Silicon Surfaces Microstructured in Air". Appl. Phys. Lett., vol. 81, No. 11, 1999-2001 (2002).

Younkin, "Surface Studies and Microstructure Fabrication Using Femtosecond Laser Pulses," Thesis presented to the Division of Engineering & Applied sciences at Harvard University (Aug. 2001).

Younkin et al., "infrared Absorption by Conical Silicon Microstructures Made in a Variety of Background Gases Using Femtosecond-Laser Pulses", J. Appl. Phys., 93, 2626-2629 (2003).

Chien et al, "Pulse Width Effect in Ultrafast Laser Processing of Materials," Applied Physics A, 2005, 1257-1263, 81, Springer Berlin, Heidelberg, Germany.

Nayak et al, "Semiconductor Laesr Crystallization of a-Si:H," SPIE Digital Library, 2003, 277-380, vol. 4977, Bellingham, Washington.

Nayak et al, "Semiconductor Laser Crystallization of a-Si:H on Conducting Tin-Oxide-Coated Glass for Solar Cell and Display Applications," Applied Physics A, 2005, 1077-1080, 80, Springer Berlin, Heidelberg, Germany.

Nayak et al, "Ultrafast-Laser-Assisted Chemical Restructuring of Silicon and Germanium Surfaces," Applied Surface Science, 2007, 6580-6583, vol. 253, Issue 15, Elsevier B.V.

Nayak et al, "Ultrafast Laser Textured Silicon Solar Cells," Mater. Res. Soc. Symp. Proc., 2009, vol. 1123, Materials Research Society.

Zhang et al, "Ultra-Shallow P+-Junction Formation in Silicon by Excimer Laser Doping: a Heat and Mass Transfer Perspective," Int. J. Heat Mass Transfer, 1996, 3835-3844, vol. 39, No. 18, Elsevier Science Ltd., Great Britain.

\* cited by examiner

_US 7,910,391 B2_

GETTER FORMED BY LASER-TREATMENT AND METHODS OF MAKING SAME

CROSS-REFERENCE TO RELATED APPLICATION

The present application claims the benefit of U.S. Provisional Application No. 61/045,680 filed on Apr. 17, 2008, hereby incorporated by reference in its entirety.

GOVERNMENT INTERESTS

Not applicable.

PARTIES TO JOIN A RESEARCH AGREEMENT

Not applicable.

INCORPORATED BY REFERENCE OF MATERIAL SUBMITTED ON A COMPACT DISC

Not applicable.

BACKGROUND

1. Technical Field

The present disclosure relates generally to laser-treated silicon substrates that are capable of gettering, and methods of making getters by laser treatment of a silicon substrate.

2. Description of Related Art

Getters are reactive materials used for removing traces of gas or moisture from various systems, e.g., in wafer scale (or wafer-level) packaging or in semiconductor manufacturing systems. In the electronics industry, a getter material may be included within a chamber enclosing an electronic device (e.g., a micro-electro-mechanical system, or "MEMS" device) or a semiconductor package to capture condensation or gases that may collect within the chamber during processing. In some cases, a getter is included within a vacuum packaged electronic device to minimize the effects of any out-gassing that may occur within the package. Getters are also used in field emission displays (FEDs).

MEMS devices are commonly made with single crystal Si or polysilicon, making it possible to fabricate them in semiconductor FABs. However, to achieve economy of scale in packaging MEMS devices, it is required to protect the released MEMS structure through the packaging line. Alternatively, wafer-level packaging can be employed. In either case, the MEMS is typically protected by another piece of silicon with an open cavity to allow the MEMS structure to move. Condensation within this cavity after it is sealed is another common problem, leading to device failure or device reliability issues due to changes in performance over time. Condensation of any kind is detrimental to the functioning of MEMS devices in particular, as it may cause the MEMS structure to stick to neighboring surfaces. Condensation can also change the mass of the MEMS structure, changing is responsivity.

SUMMARY

The present disclosure generally provides laser treatment of materials to modify the surface of the materials in a way that facilitates gettering by the materials when used in an arrangement for example substantially within an enclosed product such as a semiconductor-based MEMS device. The laser treatment is given to increase the surface area available to perform the gettering function in said devices and thereby enhance the capture and removal of certain materials by the surface of the material.

The laser treatment can be a pulsed laser of a selected intensity and type to create the desired surface features such as valleys and protrusions or cones as has been observed in "black silicon." The treatment may include laser treatment in the presence of or under a vacuum, a gas, or a liquid such as water or oil.

An embodiment of the present invention is a method of treating a silicon substrate with an ultra-fast laser to create a getter material. In an embodiment, the laser treating comprises irradiating the silicon surface with a plurality of laser pulses, wherein each laser pulse has a central wavelength of about 200 nm to about 1200 nm. In an embodiment, the laser pulse width is about 50 femtoseconds to about 50 picoseconds. In an embodiment, the number of laser pulses irradiating the silicon surface is about 2 to about 2000. In an embodiment, the repetition rate of the laser pulses is about 1 kHz to about 50 MHz. In an embodiment, the fluence of each laser pulse is about 1 $kJ/m^2$ to about 12 $kJ/m^2$.

In an embodiment, the substrate is treated in the presence of a dopant gas. In an embodiment, the substrate's treated in the presence of $SF_6$. In an embodiment, the substrate is treated in the presence of $N_2$. In another embodiment, a dopant is provided in a solid form, and may be deposited over the silicon substrate surface.

In an embodiment, a silicon layer inside a cavity covering a MEMS structure is laser treated to convert the substrate surface into a getter material. The laser treatment process can be tailored to maximize surface area for gettering moisture or gases contained within the cavity.

The substrate surface can be further modified through the addition of selectee gettering films or layers. An embodiment includes applying a gettering layer to a laser treated silicon surface. The added gettering layer may comprise titanium, zirconium thorium, hafnium, vanadium, yttrium, niobium, tantalum or molybdenum.

The invention also comprises methods of enclosing an electronic device. According to an embodiment, a method of providing a getter to a package for enclosing an electronic device is provided. The method comprises laser treating a silicon surface to convert the silicon surface to a getter, and incorporating the treated silicon surface in the package, wherein the treated silicon surface forms an inner surface of the package.

The invention comprises getter materials and semiconductor packages. In an embodiment, a gettering material is provided comprising a silicon surface doped with sulfur or nitrogen.

According to another embodiment, the invention includes a semiconductor package comprising a chamber enclosing an electronic device, wherein the chamber comprises at least one wall, wherein an inner surface of the at least one wall comprises a getter comprising nitrogen-doped or sulfur-doped silicon. In an embodiment, the electronic device is a MEMS.

Yet another embodiment includes a method of providing a getter to a wafer scale package. The method comprises providing a package having a chamber, wherein the chamber comprises an inner silicon surface; and laser treating the inner silicon surface to form a getter within the package.

Some specific embodiments are directed to a semiconductor product designed and arranged to allow gettering in a capped enclosure, including a substantially enclosed volume forming a capped enclosure to contain an article; a pulsed laser treated semiconducting surface defining at least a portion of said substantially enclosed volume; said treated semiconducting surface having an interior side thereof, proximal to said substantially enclosed volume, including microscopic features formed by pulsed laser treatment of said semiconducting surface that act as getter within said capped enclosure.

Other specific embodiments are directed to a semiconductor product, including a first portion disposed on a semiconductor substrate for supporting an article to be enclosed in a protective enclosure; a second portion including a cap formed therefrom for capping said enclosure; said first and second portions designed and constructed to have corresponding features enabling coupling of said first and second portions to form said enclosure defining a substantially enclosed volume containing said article; wherein an internal surface of any of said first or second surfaces, or both, includes features formed of a pulsed laser treatment, and said features having a gettering characteristic to provide gettering within said enclosure once said first and second surfaces are coupled to one another.

Still other specific embodiments are directed to a method for gettering, comprising treating a surface of a semiconducting material with a pulsed laser beam; forming features on said surface as a result of treating said surface with said beam; and placing at least a portion of said treated surface in an arrangement with other semiconducting articles to provide gettering within a substantially enclosed volume defined by said treated surface and said other semiconducting articles; said treated surface being disposed with relation to said substantially enclosed volume such that said features formed as a result of said treating step provide gettering to said substantially enclosed volume and to articles within said substantially enclosed volume.

Other specific embodiments are directed to a method of providing a getter to a package for enclosing an electronic device comprising laser treating a silicon surface to convert the silicon surface to a getter; and incorporating the treated silicon surface in the package, wherein the treated silicon surface forms an inner surface of the package.

Another embodiment is directed to a semiconductor package comprising a chamber enclosing an electronic device, wherein the chamber comprises at least one wall, wherein an inner surface of the at least one wall comprises a getter comprising laser-treated sulfur-doped silicon.

BRIEF DESCRIPTION OF THE DRAWINGS

For a fuller understanding of the nature and advantages of the present invention, reference should be made to the following detailed description taken in connection with the accompanying drawings, in which.

DETAILED DESCRIPTION

Before the present devices and methods are described, it is to be understood that this invention is not limited to the particular processes, devices, or methodologies described, as these may vary. It is also to be understood that the terminology used in the description is for the purpose of describing the particular versions or embodiments only, and is not intended to limit the scope of the present invention which will be limited only by the appended claims.

It must be noted that, as used herein, and in the appended claims, the singular forms "a", "an" and "the" include plural reference unless the context clearly dictates otherwise. Unless defined otherwise, all technical and scientific terms used herein have the same meanings as commonly understood by one of ordinary skill in the art. Although any methods similar or equivalent to those described herein can be used in the practice or testing of embodiments of the present invention, the preferred methods are now described. All publications and references mentioned herein are incorporated by reference. Nothing herein is to be construed as an admission that the invention is not entitled to antedate such disclosure by virtue of prior invention.

As used herein, the term "about" means plus or minus 10% of the numerical value of the number with which it is being used. Therefore, about 50% means in the range of 45%-55%.

"Optional" or "optionally" may be taken to mean that the subsequently described structure, event or circumstance may or may not occur, and that the description includes instances where the event occurs and instances where it does not.

A "laser-processed" or "laser-treated" semiconductor substrate refers to a substrate that has been modified by exposure to ultra-fast laser treatment or a substrate that has been modified by exposure to short pulsed laser treatment. An ultra-fast laser is one capable of producing femtosecond, picoseconds, or nanosecond pulse durations. The pulses are applied repetitively in some determined pattern or with some periodicity (or being non-periodic). The pulses do not need to all have the same duration. The surface of the substrate is chemically and/or structurally altered by the laser treatment, which may, in some embodiments, result in the formation of surface features appearing as microstructures or patterned areas on the surface and/or the incorporation of dopants into the substrate. For example, the laser treated substrate may include dopants that were present in a laser processing chamber during the treatment process. The substrate may be treated in the presence of, for example, a sulfur-containing gas or solid, or in a vacuum. Methods of laser-processing a substrate are known, for example, those shown by Carey et al. in U.S. Pat. No. 7,057,256, the entirety of which is hereby incorporated by reference.

Figure 1:
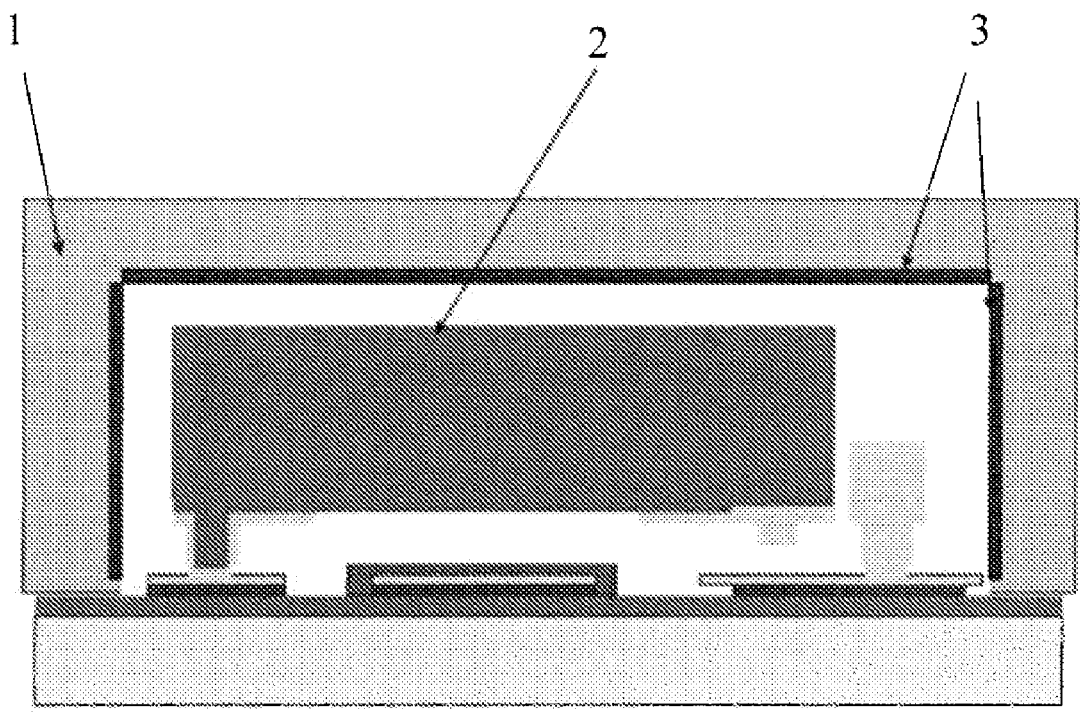
FIG. 1 depicts an exemplary wafer scale package die having a laser treated silicon surface.

FIG. 1 shows an exemplary wafer scale package die having a laser treated silicon surface. The exemplary wafer scale package die includes a silicon protective cover (1) surrounding a MEMS structure (2). The exemplary device shown includes an interior laser treated silicon package surface (3) of the invention. It will be understood by one of skill in the art that the invention is not limited to the package die shown in FIG. 1, but may include a gettering surface, as prepared by the methods of the invention, on one or more surfaces in the interior side of a substantially enclosed volume.

Figure 2:
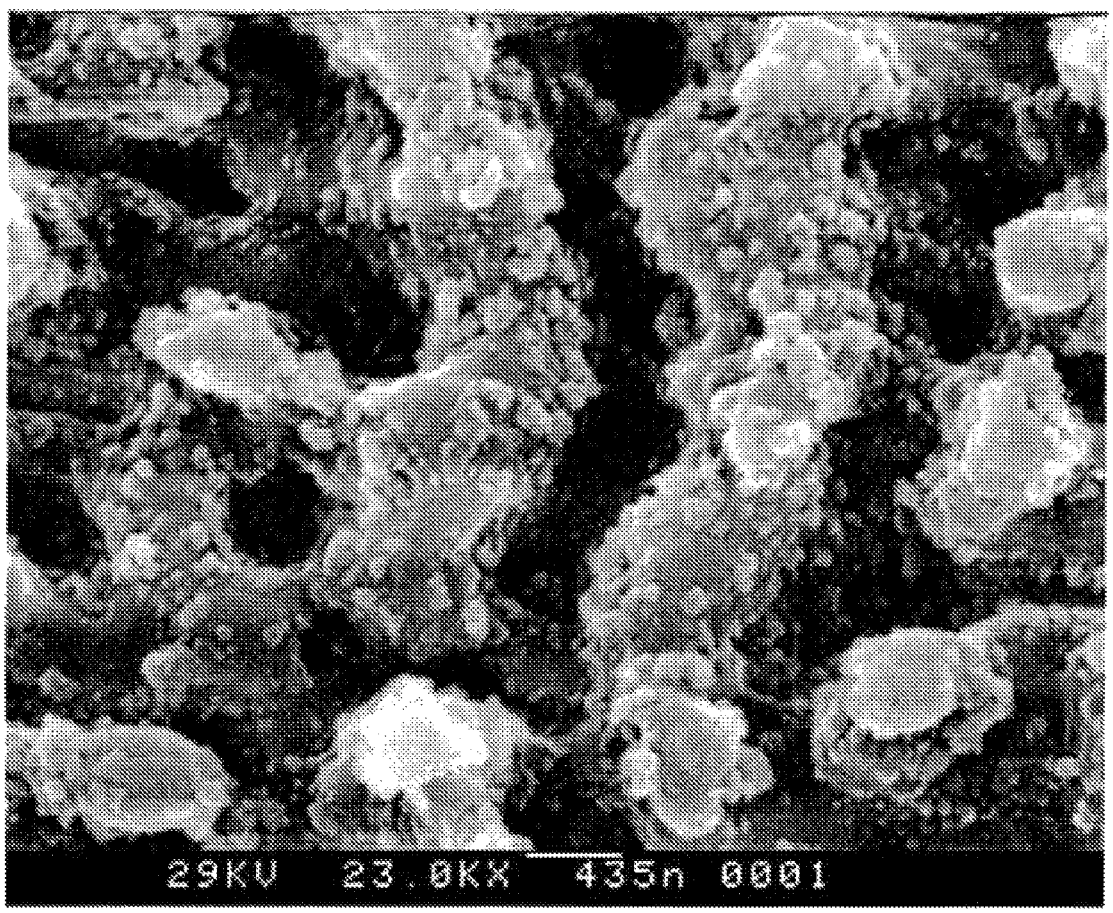
FIGS. 2 and 3 are scanning electron micrographs of a laser treated silicon surface prepared according to a method of the invention.
Figure 3:
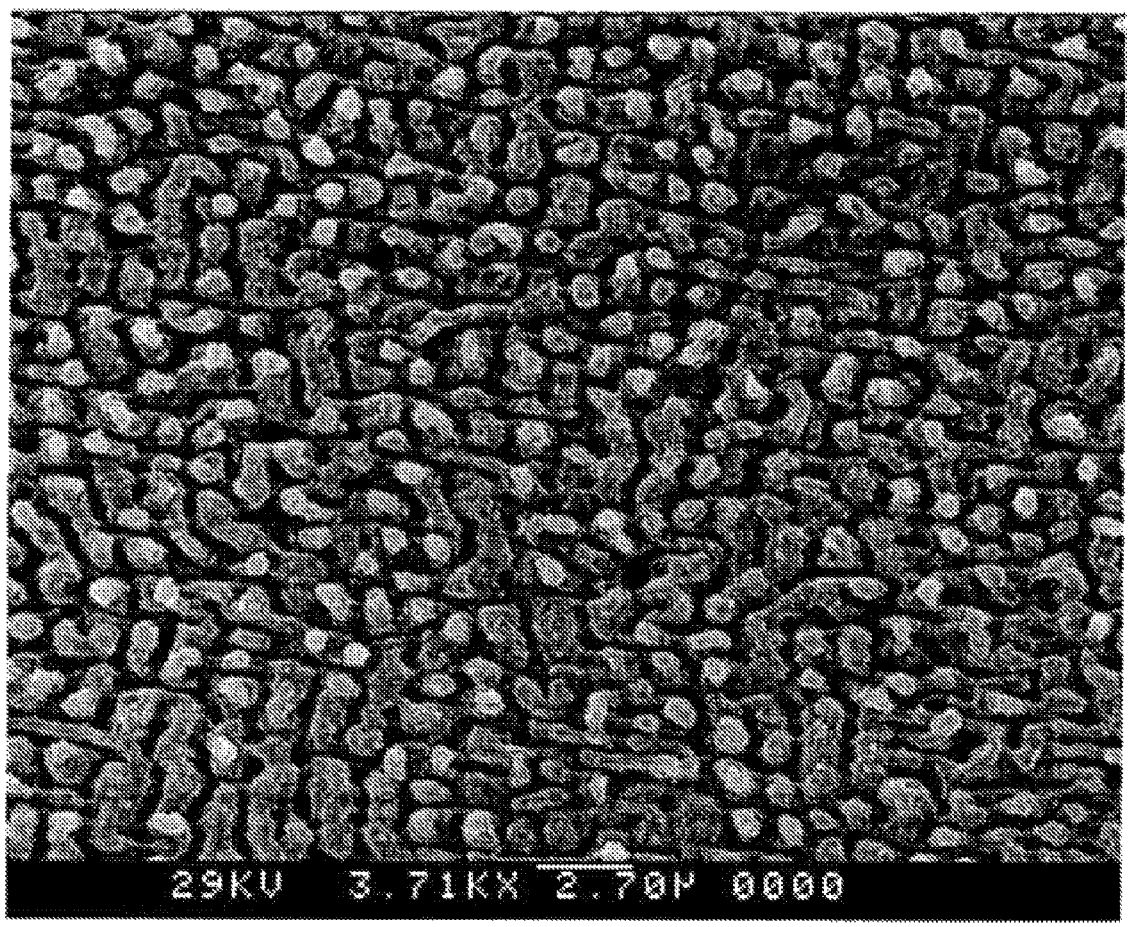

FIGS. 2 and 3 are scanning electron micrographs of a laser treated silicon surface.

In one aspect, the present invention provides a method of treating a silicon substrate comprising laser treating or laser processing the substrate. In an embodiment, laser treating comprises irradiating a surface of the substrate with one or more laser pulses to create a getter. The laser pulses can have a central wavelength in a range of about 200 nm to about 1200 nm, and a pulse width in a range of about tens of femtoseconds to about hundreds of nanometers. Preferably, the laser pulse widths are in a range of about 50 femtoseconds to about 50 picoseconds. In an embodiment, the laser pulse widths are in the range of about 50 to 500 femtoseconds. The number of laser pulses irradiating the silicon surface can be in a range of about 2 to about 20, and more preferably, in a range of about 20 to about 500. Further, the repetition rate of the pulses can be selected to be in a range of about 1 kHz to about 50 MHz, or in a range of about 1 kHz to about 1 MHz. Moreover, the fluence of each laser pulse can be in a range of about 1 kJ/m² to about 12 kJ/m², and more preferably in a range of about 3 kJ/m² to about 8 kJ/m².

In some embodiments, the semiconductor material is treated by laser pulsed radiation in the presence of or in contact with a vacuum, a gas, or a liquid. This can affect the surface and the shape and uniformity of its microstructure in a way to enhance the gettering effect as desired for a given application. For example the laser treatment can be performed in a vacuum or partial vacuum, or it can be performed in the presence of a gas, or it can be performed in the presence of water or oil to create the optimum gettering surface.

"Capacity" of a getter (or "gettering capacity") refers to the getter's ability to absorb moisture or contaminants. Getters produced according to the methods of the invention may be prepared to have various sorption capacities, depending on the requirements of a given system.

Devices and methods for irradiating a silicon substrate are known in the art, as described, for example in U.S. Pat. No. 7,057,256, incorporated herein by reference.

In an embodiment, a silicon substrate is irradiated in the presence of a sulfur-containing dopant, and the resulting getter comprises sulfur from about 0.2 atom percent to about 0.7 atom percent.

In an embodiment, a substrate is irradiated to create an undulating or micro-structured surface morphology, as described, for example in U.S. Pat. No. 7,057,256. Depending on the conditions of laser processing, the surface morphology can range between having microstructures that are relatively variable in size, shape, and spacing to relatively uniform in size, shape, and spacing. In an embodiment, the microstructures appear in a highly uniform pattern in which their sizes do not vary by more than 5% from one another. According to the invention, highly uniform surface features or microstructures can be produced without the use of photolithography or an artificial scaffold.

For example, the wavelength of an irradiating laser pulse, its fluence, and pulsewidth can affect the morphology of the nicrostructured surface. In general the fluence is preferably selected to be between about 1.5 kJ/m² and 12 kJ/m², but may vary depending on the substrate composition. Additionally, the pulse length can affect morphology. Irradiation of a substrate according to the invention can be with femtosecond laser pulses or picosecond or nanosecond pulses. Other factors that can affect microstructures morphology include laser polarization and laser propagation direction relative to the irradiated silicon surface.

The fluid or solid in contact with the silicon surface during its microstructuring can also affect the resultant surface morphology. As known in the art, the dopant gas or material used can be varied to control the shape, size and density of microstructures on a substrate.

In some embodiments, the laser microstructuring of a substrate is performed in the presence of a mixture of two or more substances. For example, samples microstructured in the presence of a mixture of $SF_6$ and $Cl_1$ exhibit an increase in the microstructure density at higher partial pressure of $SF_6$.

One aspect of the invention relates to annealing a silicon wafer, subsequent to—or simultaneous with—its irradiation by a plurality of short pulses in the presence of a substance having an electron-donating constituent, under conditions that would release electrons in the microstructured layer. Thus, in an embodiment, a laser treated silicon substrate is annealed. In an embodiment, the annealing temperature is selected to be in range of about 500 K to about 1100 K, and more preferably in a range of about 700 K to about 900 K. Alternatively, higher annealing temperatures can be employed. A substrate is annealed for a duration of about 1 minute to about several hours, and more preferably in a range of about 5 minutes to about 30 minutes. To a certain extent, annealing temperature and duration are inter-related. For example, shorter annealing time at a higher temperature can be employed in certain applications.

The choice of the fluence of laser pulses irradiating a silicon wafer to generate a microstructured layer therein can also affect the gettering performance (capacity and/or specificity) of a microstructured substrate. In general, in various embodiments of the invention, the laser pulse fluence is selected to be greater than about 3 kJ/m². More preferably, the fluence is chosen to be in a range of about 3 kJ/m² to about 10 kJ/m², or a range of about 3 kJ/m² to about 8 kJ/m².

In an embodiment of the invention an n-doped silicon substrate is employed for forming a microstructured substrate, as described above. Alternately, a p-doped silicon substrate can be utilized.

In an embodiment, a laser treated silicon substrate prepared according to the invention may be activated to provide additional gettering capacity. That is, the substrate following use or deterioration of gettering properties can be heated to cause a passivation layer at the surface to diffuse into the substrate, resulting in a getter surface onto which additional impurities or gases may adsorb. Heat sources for activation may include radiofrequency, laser or an oven, and heating may be in the range of about 250° C. to about 450° C.

In an embodiment, the laser treated silicon substrate of the invention can be further modified by applying a getter layer or film to the microstructured surface. Thus, the invention includes a method of making a getter by applying a getter film or layer to a sulfur-doped silicon substrate. In an embodiment, the getter layer or film is applied by sputter deposition. The getter film or layer may be evaporable or non-evaporable, depending on the desired performance. In an embodiment, the getter layer or film formed on the laser treated silicon substrate is a getter and comprises titanium, zirconium, thorium, hafnium, vanadium, yttrium, niobium, tantalum or molybdenum. Additional getter materials may be used as are known in the art. In another embodiment, the getter layer or film is an alloy, for example a zirconium-based alloy. In an embodiment, the getter layer is barium. An embodiment of the invention includes a sulfur-doped silicon substrate having a patterned surface and comprising a getter layer or film.

A getter film or layer, when included, may be actuated to provide additional gettering capacity. That is, the getter layer or film can be heated to cause a passivation layer at the surface to diffuse into the getter, resulting in a getter surface into which additional impurities or gases may absorb. A variety of heat sources for activation are known in the art, and may include, for example, radiofrequency laser or an oven, and heating may be in the range of about 250° C. to about 450° C.

In an embodiment, a laser treated surface comprises an adhesion layer between the silicon layer and the applied getter layer or film. An adhesion layer may comprise Ta, Ti, or TiW. According to an alternative embodiment, a gettering layer is applied to a laser treated silicon substrate without including an adhesion layer.

The present invention should not be considered limited to the particular embodiments described above, but rather should be understood to cover all aspects of the invention as fairly set out in the attached claims. Various modifications, equivalent processes, as well as numerous structures to which the present invention may be applicable, will be readily apparent to those skilled in the art to which the present intention is directed upon review of the present specification. The claims are intended to cover such modifications and devices.

The invention and embodiments thereof illustrating the method and materials used may be fisher understood by reference to the following non-limiting examples.

What is claimed is:

1. A method for gettering, comprising:
   treating a surface of a semiconducting material with a pulsed laser beam;
   forming features on said surface as a result of treating said surface with said beam; and
   placing at least a portion of said treated surface in an arrangement with other semiconducting articles to provide gettering within a substantially enclosed volume defined by said treated surface and said other semiconducting articles;
   said treated surface being disposed with relation to said substantially enclosed volume such that said features formed as a result of said treating step provide gettering to said substantially enclosed volume and to articles within said substantially enclosed volume.

2. The method of claim 1 wherein the treating step comprises irradiating the surface with a plurality of laser pulses, wherein each laser pulse has a central wavelength of about 200 nm to about 1200 nm.

3. The method of claim 1 wherein the treating step comprises irradiating the surface with a plurality of laser pulses, wherein the laser pulse width is about 50 femtoseconds to about 50 picoseconds.

4. The method of claim 1 wherein the treating step comprises irradiating the surface with a plurality of laser pulses, and the number of laser pulses irradiating the surface is between about 2 to about 2000 pulses.

5. The method of claim 1 wherein the treating step comprises irradiating the surface with a plurality of laser pulses, wherein the repetition rate of the laser pulses is about 1 kHz to about 50 MHz.

6. The method of claim 1 wherein the treating step comprises irradiating the silicon surface with a plurality of laser pulses, wherein the fluence of each laser pulse is about 1 $kJ/m^2$ to about 12 $kJ/m^2$.

7. The method of claim 1, further comprising adding a gettering layer to the treated semiconducting material, the gettering layer comprising titanium, zirconium, thorium, hafnium, vanadium, yttrium, niobium, tantalum or molybdenum.

* * * * *